(12) United States Patent  
Caletka et al.

(10) Patent No.: US 7,875,811 B2
(45) Date of Patent: Jan. 25, 2011

(54) HIGH SPEED INTERPOSER

(75) Inventors: David V. Caletka, Apalachin, NY (US); Frank D. Egitto, Binghamton, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 84 days.

(21) Appl. No.: 12/010,335

(22) Filed: Jan. 24, 2008

(65) Prior Publication Data

US 2008/0142258 A1 Jun. 19, 2008

Related U.S. Application Data

(62) Division of application No. 11/454,896, filed on Jun. 19, 2006, now Pat. No. 7,629,541.

(51) Int. Cl.
*H01R 12/04* (2006.01)
*H05K 1/11* (2006.01)
(52) U.S. Cl. .................... 174/262; 174/260
(58) Field of Classification Search .......... 174/262–266
See application file for complete search history.

(56) References Cited

U.S. PATENT DOCUMENTS

| | | | |
|---|---|---|---|
| 5,530,288 A | 6/1996 | Stone | |
| 5,599,193 A | 2/1997 | Crotzer | |
| 5,689,091 A * | 11/1997 | Hamzehdoost et al. | 174/255 |
| 6,097,609 A | 8/2000 | Kabadi | |
| 6,097,611 A | 8/2000 | Samaras et al. | |
| 6,137,161 A | 10/2000 | Gilliland et al. | |
| 6,312,266 B1 | 11/2001 | Fan et al. | |
| 6,471,525 B1 | 10/2002 | Fan et al. | |
| 6,528,892 B2 | 3/2003 | Caletka et al. | |
| 6,598,291 B2 * | 7/2003 | Parker et al. | 29/846 |
| 6,617,526 B2 * | 9/2003 | Miller | 174/261 |
| 6,638,077 B1 | 10/2003 | Fan et al. | |
| 6,937,120 B2 * | 8/2005 | Fisher et al. | 333/246 |
| 6,954,984 B2 | 10/2005 | McAllister et al. | |
| 7,081,650 B2 * | 7/2006 | Palanduz et al. | 257/310 |
| 2004/0196122 A1 * | 10/2004 | Fisher et al. | 333/246 |
| 2004/0212971 A1 * | 10/2004 | Iguchi | 361/780 |

* cited by examiner

*Primary Examiner*—Ishwarbhai B Patel
(74) *Attorney, Agent, or Firm*—Mark Levy; Lawrence R. Fraley; Hinman, Howard & Kattell

(57) ABSTRACT

A high speed interposer which includes a substrate having alternatingly oriented dielectric and conductive layers which form a substrate, openings which extend from one opposing surface of the substrate to a second opposing surface, conductive members positioned within the openings and also extending from surface to surface (and beyond, in some embodiments), and a plurality of shielding members positioned substantially around the conductive members to provide shielding therefore during the passage of high frequency signals through the conductive members.

5 Claims, 7 Drawing Sheets

HIGH SPEED INTERPOSER

The present application is a divisional of Ser. No. 11/454,896 filed on Jun. 19, 2006, now U.S. Pat. No. 7,629,541. The above applications are assigned to the same Assignee as the present invention, Endicott Interconnect Technologies, Inc.

TECHNICAL FIELD

The present invention relates to electrical connectors and, more particularly, to electrical connectors for interconnecting circuitized substrates such as printed circuit boards (hereinafter also referred to as PCBs), chip carriers, or the like, especially those which may be used in information handling systems (e.g., computers, computer servers, mainframes, etc.).

CROSS REFERENCE TO CO-PENDING APPLICATIONS

In Ser. No. 11/086,324, filed Mar. 23, 2005, there is defined a circuitized substrate in which at least one signal line used therein is shielded by a pair of opposingly positioned ground lines which in turn are electrically coupled to a ground plane located beneath the signal and ground lines and separated there-from by a common interim dielectric layer. An electrical assembly including the circuitized substrate as part thereof and a method of making the circuitized substrate are also included. The substrate may form part of a larger structure such as a PCB, chip carrier or the like.

In Ser. No. 11/401,401, filed Apr. 11, 2006, there is defined a circuitized substrate in which selected ones of the signal conductors are substantially surrounded by shielding members which shield the conductors during passage of high frequency signals, e.g., to reduce noise. The shielding members may form solid members which lie parallel and/or perpendicular to the signal conductors, and may also be substantially cylindrical in shape to surround a conductive thru-hole which also forms part of the substrate. An electrical assembly and an information handling system are also defined.

In Ser. No. 11/454,896, filed Jun. 19, 2006, there is defined a high speed interposer which includes a substrate having alternatingly oriented dielectric and conductive layers which form a substrate, openings which extend from one opposing surface of the substrate to a second opposing surface, conductive members positioned within the openings and also extending from surface to surface (and beyond, in some embodiments), and a plurality of shielding members positioned substantially around the conductive members to provide shielding therefore during the passage of high frequency signals through the conductive members.

BACKGROUND OF THE INVENTION

Electrical connectors used in many of today's products such as those described above must provide high electrical performance, high density and highly reliable connections between various circuit devices, which form important parts of these products.

Improvement of signal integrity (performance) for such connectors may be accomplished by providing the interconnections with shielding, thus helping these to more closely match the desired product's impedance. To enable effective repair, upgrade, and/or replacement of various components of the product (e.g., connectors, cards, chips, boards, modules, etc.), it is also highly desirable that such connections be separable and re-connectable in the field. Such a capability is also desirable during the manufacturing process for such products in order to facilitate testing, for example. Both of these features (shielding and separability) must be provided in such a manner so as to assure a final product which is highly reliable and cost effective. In this regard, it is understood that one or more misconnections within critical parts of the overall product may result in product failure and the need for costly replacement.

A land grid array (hereinafter also referred to as an LGA) interposer connector (hereinafter also simply referred to as an interposer) is an example of such a connector in which each of two primarily parallel circuit elements to be connected has a plurality of contact points, arranged in a linear or two-dimensional array. An array of interconnection elements (the LGA interposer) is placed between the two arrays to be connected, and provides the electrical connection between the contact points or pads. An LGA interposer typically includes at least one conductive plane sandwiched between two dielectric planes. The conductive plane typically includes a pattern of circuitry. A plurality of plated through holes (hereinafter also referred to as PTH's) are formed through the planes of the interposer so that the pattern of plated through holes formed on one surface of the interposer matches the pattern of ground, power and signal sites on the chip carrier or other electrical component; and the pattern of plated through holes on the opposite side of the interposer matches the pattern of ground, power, and signal sites on the PCB or other circuitized substrate. Examples of LGA and similar interposers are known in the art, with examples provided below. It is to be understood that the invention is not limited to LGA connectors but is applicable to many other kinds of connectors and modules.

In U.S. Pat. No. 7,176,383, there is defined a printed circuit board and method of making same in which the board includes a common power plane having dielectric layers on opposing sides thereof and a signal layer on each of said dielectric layers, each signal layer comprising a plurality of substantially parallel signal lines running in substantially similar directions across the signal layers. Predetermined portions of the signal lines in one signal layer are aligned relative to and also parallel to corresponding signal lines in the other signal layer, with the power plane being located between these portions. Through hole connections are provided between selected signal lines in the two layers, these occurring through clearance holes in the power plane so as to be isolated there-from. U.S. Pat. No. 7,176,383 is assigned to the same assignee as the present invention.

In U.S. Pat. No. 6,954,984, there is described an Land Grid Array structure which includes a flexible film interposer that provides electrical connection between a multi-chip module and the next level of integration such as a system board while allowing for engineering change capabilities as well as a means for decoupling power to ground structure to minimize switching activity effects on the overall system using this structure.

In U.S. Pat. No. 6,638,077, there is described a shielded carrier with electrical components, resulting in an LGA interposer connector with apparent improved electrical performance and enhanced functionality. The carrier includes components such as resistors and capacitors on and/or in the carrier. The components are preferably of the surface mount variety or are imbedded within the carrier, due to the inherent lower profile of these form factors. Decoupling capacitors and terminating resistors are two examples of components that may improve performance.

In U.S. Pat. No. 6,528,892, there is described a flexible chip carrier with contact pads on its upper surface matching those of the chip with the pads conductively connected to LGA pads on its lower surface matching those of a PCB. The chip carrier is provided with a stiffening layer at the LGA interface which is mechanically attached to the lower surface of the chip carrier. Holes are formed in the stiffening layer to expose the LGA pads. The holes are then filled with a conductive adhesive material. Compliant LGA bumps are applied to the uncured conductive adhesive material and the material is then cured.

In U.S. Pat. No. 6,471,525, there is described a carrier with electrical shielding of individual contact elements, resulting in an LGA interposer connector with alleged improved electrical performance. The carrier includes a plurality of openings, each of which may contain an individual contact element. The openings may be plated with conductive material, and may also be commoned to one or more reference voltages (e.g., ground) present on at least one conductive layer of the carrier. The carrier may be a single unified structure with a conductive layer on one outer surface, or much more complex, having many layers of dielectric and conductive material.

In U.S. Pat. No. 6,312,266, there is described a carrier that provides improved retention to the individual contact elements resulting in an LGA interposer connector with apparent improved mechanical and electrical performance. In one embodiment, the carrier, which includes upper and lower sections of dielectric material with an adhesive layer in between, includes a plurality of openings, each of which may contain an individual contact element. During assembly of the connector, once the contact elements are inserted, the adhesive layer is reflowed, thereby allowing the carrier to capture the location of the contact elements both with respect to each other as well as to the carrier. Alternately, the carrier may be implemented in a manner which, while not including an adhesive layer to be reflowed, still provides improved retention of the individual contact elements.

In U.S. Pat. No. 6,137,161, there is described a semiconductor package which includes an interposer with upper surface contacts aligned with circuit chip contacts and lower surface contacts aligned with the corresponding contacts on a supporting substrate. The interposer includes a series of ground plane layers which are capacitively coupled to the conductors that connect the upper surface contacts to the lower surface contacts. The ground plane layers closest to the circuit chip have plates there-between and electrically separated there-from which are connected to the power input supply lines to form decoupling capacitances. The ground plane layers more remote from the circuit chip have, there-between and electrically separated there-from, conductive flange portions attached to individual signal lines to form a low pass feed-through filter for each signal line. The capacitance of the flange portions is designed to establish the correct roll off to pass the desired signals and shunt to ground the unwanted harmonics while the decoupling capacitance is sized to afford the required, stabilized power supply. The semiconductor package also may include a conductive shield member that surrounds the top and four sides of the package and is connected to the grounded elements of the interposer to provide mechanical connection and apply ground potential to the shield.

In U.S. Pat. No. 6,097,611, there is described an LGA carrier which includes an interposer having a first surface and a second surface opposite the first surface, with a plurality of locations on the first surface adapted to receive a plurality of semiconductor dice and passive components. The second surface has a plurality of conductive pads coupled thereto.

In U.S. Pat. No. 6,097,609, there is described an electronic packaging assembly in which an electronic component is disposed on a socketing substrate utilizing a ball grid array or LGA. The socketing substrate contains a series of pins that are embedded within the thickness of the socketing substrate, these pins corresponding to the ball grid array or land grid array contacts of the electronic component. The socketing substrate is mounted onto a motherboard using an array of solder balls that correspond to and are disposed on, the end of the pins facing the motherboard. If desired, the electronic component may be protected by a metal lid.

In U.S. Pat. No. 5,599,193, there is described an electrical interconnector for connecting an integrated circuit or other electrical or electronic component to a circuit board or for interconnecting two or more circuit boards. The interconnector comprises a substrate having one or more resilient elements of a non-conductive material and having opposite contact surfaces. A flexible conductive coating is provided on the contact surfaces of the resilient elements and extends between the contact surfaces to provide electrical connection therebetween. In one embodiment, each element is integrally formed with a resilient substrate and has electrically conductive contact surfaces which are outward of the respective substrate surfaces and are electrically connected through a conductive surface which extends through vias (openings) formed in the substrate. In another embodiment, each element is individually formed and is disposed within a corresponding cavity of a separate substrate. In a further embodiment, each element is individually formed having different sections of different durometers so as to provide intended spring or resilience characteristics. A particulate layer can be provided on the conductive contact surfaces to provide a roughened surface by which an oxide layer on a mating electrical contact is penetrated to minimize contact resistance.

In U.S. Pat. No. 5,530,288, there is described an interposer including a first face and second face opposite the first face and at least one electrically conductive plane. The conductive plane functions as a power, ground, or signal plane. At least one electrically insulating plane is positioned on opposite sides of the conductive plane. A plurality of PTHs are formed through the conductive plane and the two insulating planes. The PTHs are selectively electrically joined to the conductive plane. At least one passive electronic structure is positioned within the interposer structure.

As understood from the following description, the present invention provides an interposer with improved shielding of various conductors therein in a new and unique manner and which can be produced using conventional PCB manufacturing processes which require little or no modification thereto. It is believed that such an invention will constitute a significant advancement in the art.

OBJECTS AND SUMMARY OF THE INVENTION

It is a primary object of the invention to enhance the electrical connector art and particularly that aspect of the art which involves electrical interposers such as those used to interconnect electrical components such as semiconductor devices, chip carriers and the like with circuitized substrates such as PCBs.

It is another object of the invention to provide such an interposer with enhanced electrical functioning capabilities, especially improved shielding.

It is yet another object of the invention to provide such an interposer which can be produced using conventional PCB manufacturing processes which require little or no modification thereto, thereby providing an end product which is cost effective. According to one aspect of the invention, there is provided.

According to one aspect of the invention, there is provided an interposer comprising a substrate including first and second opposing surfaces, the substrate including a plurality of dielectric layers and a plurality of conductive layers oriented within the substrate in an alternating manner with respect to the dielectric layers, a plurality of openings extending substantially through the substrate from the first opposing surface to the second opposing surface, a plurality of conductive members, each positioned within a respective one of the openings and extending substantially from the first opposing surface of the substrate to said second opposing surface of the substrate, and a plurality of shielding members positioned within the substrate and substantially extending from the first opposing surface to the second opposing surface, each shielding member being positioned substantially around a respective conductive member at a spaced distance there-from and adapted for providing shielding for the respective conductive member during the passage of high frequency signals through the conductive member.

According to another aspect of the invention, there is provided a method of making an interposer which comprises providing a substrate including first and second opposing surfaces and including a plurality of dielectric layers and a plurality of conductive layers oriented within said substrate in an alternating manner with respect to the dielectric layers, forming a plurality of openings within the substrate which extend substantially through the substrate from the first opposing surface to the second opposing surface, providing a conductive member within each of the openings which extends substantially from the first opposing surface to the second opposing surface, and forming a plurality of shielding members within the substrate which each also extend substantially from the first opposing surface to the second opposing surface and which is positioned substantially around a respective conductive member at a spaced distance there-from, each shielding member being adapted for providing shielding the respective conductive member during the passage of high frequency signals through the conductive member.

BEST MODE FOR CARRYING OUT THE INVENTION

Figure 1:
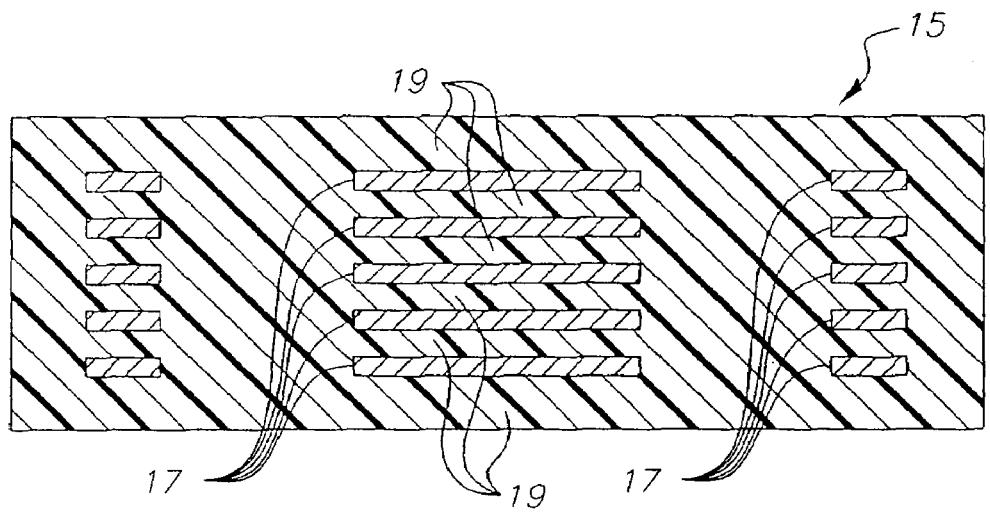
FIGS. 1-4 are much enlarged, partial side elevational views, in section, representing the initial steps of making an interposer of the invention.

For a better understanding of the present invention, together with other and further objects, advantages and capabilities thereof, reference is made to the following disclosure and appended claims in connection with the above-described drawings. Like figure numbers will be used from FIG. to FIG. to identify like elements in these drawings.

By the term "substrate" as used herein is meant to include structures having plurality of dielectric layers and a plurality of electrically conductive layers, at least some of both being arranged in an alternating manner, e.g., dielectric layer—conductive layer—dielectric layer—conductive layer, etc. Examples of dielectric materials usable for such substrates include fiberglass-reinforced epoxy resins (some referred to as "FR4" dielectric materials in the art, for the flame retardant rating of same), polytetrafluoroethylene (e.g., Teflon), polyimides, polyamides, cyanate resins, photo-imageable materials, and other like materials. Examples of conductor materials usable in such substrates include copper or copper alloys, but may include or comprise additional metals (e.g., nickel, aluminum, etc.) or alloys thereof. Such conductor materials are used to form layers which may serve as power, signal and/or ground layers. If as a signal layer, several conductor lines and/or pads may constitute the layer, while if used as power or ground, such layers will typically be of substantially solid construction. Combinations of signal, power and/or ground are possible in one substrate, and combinations of signal, power and/or ground are possible in one conductive layer. Examples of substrates include the aforementioned printed circuit boards (or cards) and chip carriers, when the conductive layers are "circuitized", meaning these are capable of carrying signals (if a signal layer), power (if a power layer) or serving as ground (if a ground layer).

Conductive thru-holes are known in the substrate art, and are often referred to as "vias" if internally located (entirely within the substrate's outer confines), "blind vias" if extending a predetermined depth within the substrate from an external surface, or "plated thru-holes" (PTHs) if extending substantially through the substrate's full thickness. By the term "thru-hole" as used herein, therefore, is meant to include all three types of such substrate openings.

As understood, the term "high frequency" as used herein is meant signals of high speed. Examples of such signal frequencies attainable for the substrates produced in accordance with the teachings herein include those within the range of as high as from about 3.0 to about 10.0 gigabits per second (GPS). These examples are not meant to limit this invention, however, because frequencies outside this range, including those higher, are attainable.

By the term "electrical assembly" as used herein is meant an assembly including at least one interposer as taught herein and at least one semiconductor chip which is electrically coupled to the interposer, e.g., through use of a laminated carrier.

In FIG. 1, a substrate 15 is shown, this member including a plurality (i.e., five are shown albeit more or fewer may be utilized) of electrically conductive layers (planes) 17 therein. Each layer 17 may be a signal, power or ground, or combination of these, depending on the operational requirements for the finished product. Substrate 15 also includes a plurality of layers 19 of dielectric material of the types defined above. Layers 17 and 19 are preferably oriented in an alternating manner, as shown, albeit it is possible to provide two or more dielectric layers as one larger layer, if desired. In one embodiment, each of the five conductive layers 17 may possess a thickness of about one mil (a mil being 0.001 inch), while each of the dielectric layers may possess a thickness of from about 2.5 mils to about twenty mils. If a conductive layer is a signal layer, it will typically be comprised of individual segments (traces, or lines). The example shown in FIG. 1 (and in subsequent FIGS.) depicts such a plurality (i.e., three) of traces or lines for each of the five conductive layers. If one or more of these layers is to function as power or ground, it would most preferably be of solid and not the segmented configuration shown. Layers 17 and 19 are bonded together, preferably, using conventional lamination processing as is known in the PCB and chip carrier art.

Figure 2:
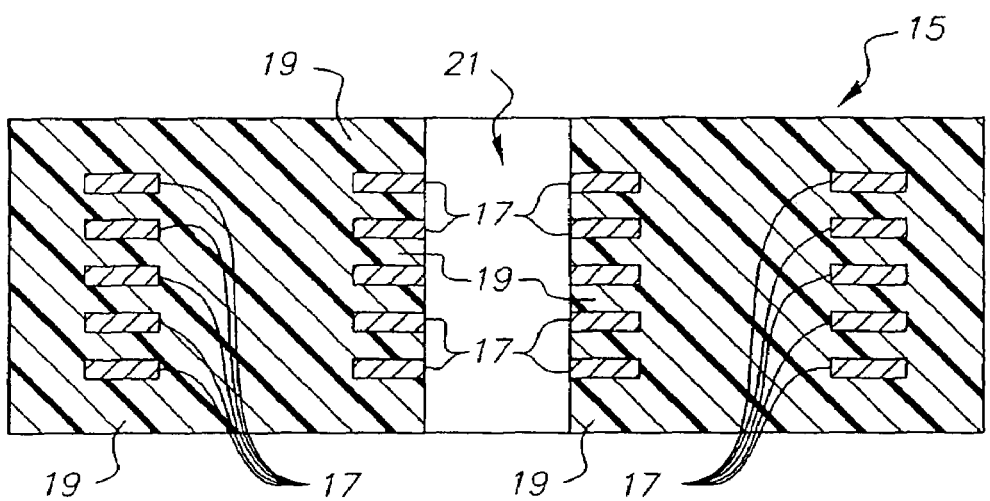

In FIG. 2, an opening 21 is formed within substrate 15, between opposing surfaces (top and bottom), as shown. That is, the opening extends through the entire thickness of the substrate. Opening 21 may be formed using laser or mechanical drilling, various types of same being known in the PCB art and further description is not considered necessary. In one embodiment, more than one opening is preferably formed so the invention is not limited to the use of only one as shown in FIG. 2. It is possible to provide as many as 1500 such openings within a substrate having length and width dimensions of 1970 mils and 1970 mils, respectively, thereby illustrating the high density patterns of these attainable using the instant invention's teachings. The total number of such openings will thus vary, again depending on the overall size of the final product as well as the desired operational requirements thereof. In one embodiment, opening 21 may have a diameter of twenty mils and extend the full thickness of member 15, member 15 having an overall thickness within the range of from about twenty mils to about 200 mils. Opening 21 is understood to be of substantially cylindrical configuration, but this is not meant to limit the invention. Opening 21 is also shown to penetrate through a portion of each of the conductive layers 17. This also is not meant to limit the invention, as better understood from the following. That is, any number of such layers 17 may be so connected to layer 23. If more than one, each will be of the same potential.

Figure 3:
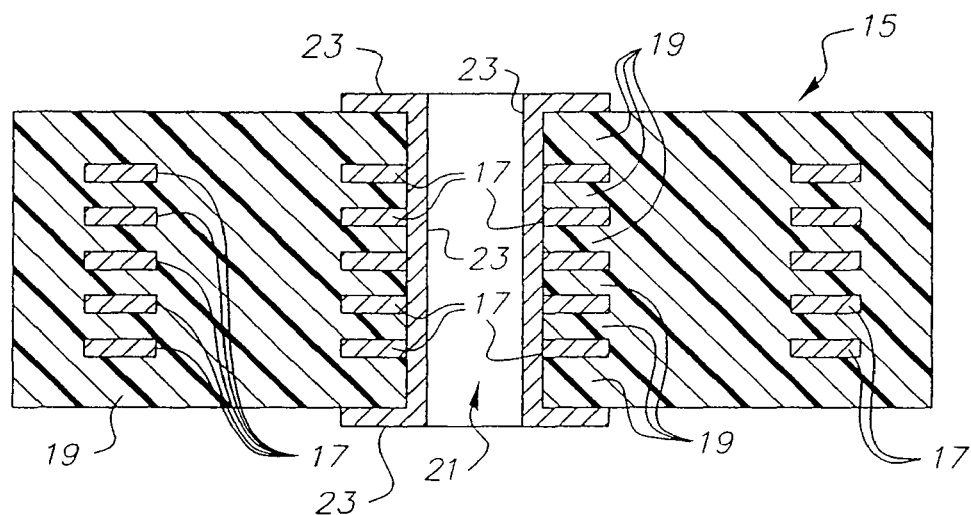

Following opening formation (which may include cleaning of the interior walls of the substrate, again, using conventional PCB processing), opening 21 is rendered conductive by applying a metal layer 23 to the opening's interior surfaces and, as shown in FIG. 3, to the immediately adjacent exterior surfaces of substrate 15 about the open end portions of the opening. Each of these extending surface portions, if added, are also referred to in the PCB art as "lands." The invention is not limited to such usage, however, because the internal layer 23 needs only be located on the vertical internal surfaces of opening 21. Such "lands" may be preferred, however, if the respective exterior surfaces on which these reside will also include additional circuitry, e.g., signal lines, some of which may be coupled to respective "land" segments. In one embodiment, layer 23 is copper or an alloy thereof and is applied using electroplating. Either electrolytic or electroless plating may be used for this plating operation. Such methods, like those defined above, are also known in the PCB and chip carrier art and further description is not, therefore, deemed necessary. It is within the scope of the invention to provide metals other than copper or copper alloy. Further, added layers such as nickel and a precious metal such as gold may also be applied, as is also known in the art. In one example, layer 23 may possess a thickness of from about 0.5 mils to about 1.5 mils. Significantly, the layer 23 of opening 21 is of solid configuration and thus forms a solid "wall" at a spaced distance around the opening's central axis. Other conductive openings, if used, will provide similar "walls" at other locations.

Figure 4:
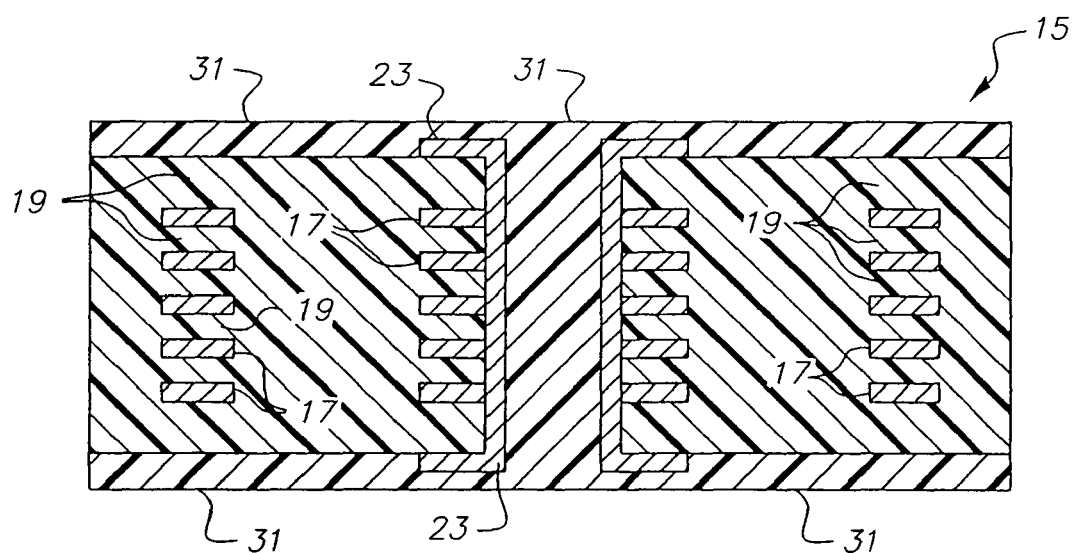

In FIG. 4, a quantity of dielectric material 31 is bonded onto substrate 15. Such bonding may be accomplished using a conventional PCB lamination process, liquid application or vacuum lamination. Various dielectric materials may be used, with examples including solder mask material and resin-coated copper materials. Examples of solder mask materials include the Valu-SMT® series of materials sold by E.I. duPont de Nemours and Company, the Probimer® solder mask series of materials sold by the Ciba-Geigy Corporation, and the 503B-SH and MR-300RV/-300B series of solder mask materials from Asahi Chemical Research Company. A resin coated copper material usable for the invention is sold under the product name LG-F-2000G by the LG Chem Company. Material 31 fills opening 21 and forms a layer on each of the opposite surfaces of substrate 15, as shown. In one example, each outer layer may possess a thickness of from about one mil to about three mils. Material 31 is cured and/or dried, if needed, to become hardened to an extent similar as that of "C-staged" conventional dielectric materials used in many PCB products (e.g., the aforementioned "FR4" material). Material 31 may also be the same as that used for the dielectric layers 19 in member 15.

Figure 5:
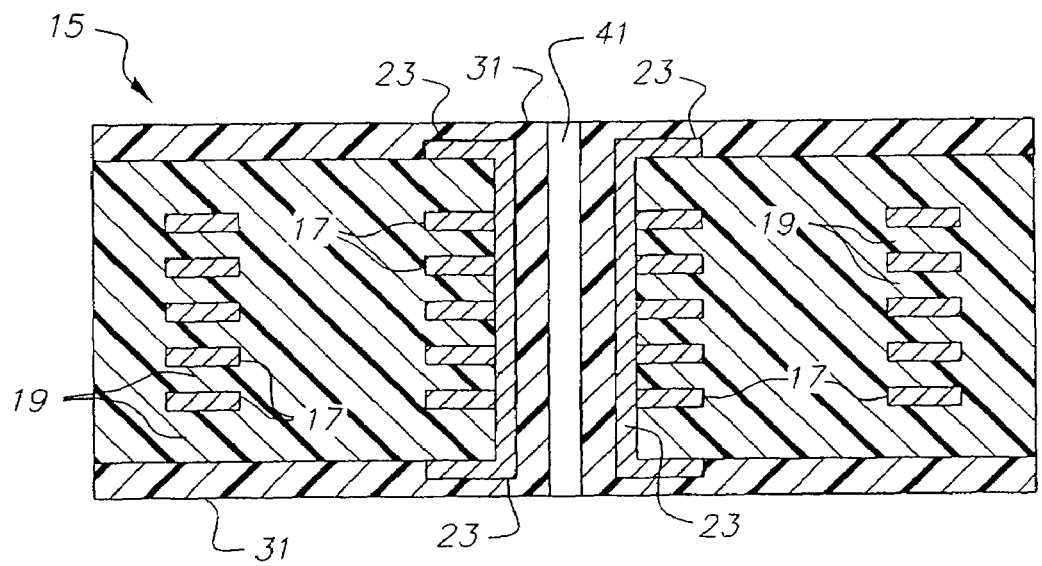
FIGS. 5 and 6 are much enlarged, partial side elevational views, in section, representing the steps of making a pinned interposer according to one embodiment of the invention, these steps following the steps of FIGS. 1-4 above.

FIG. 5 is understood to be the beginning of a series of steps following those defined above with respect to FIGS. 1-4 toward making what will be referred to as a pinned interposer, meaning a substrate as shown herein in which a plurality of elongated conductive (e.g., solid copper) pins are used. These pins, understandably, extend through the entire thickness of substrate 15 and, in some cases, may project externally from one or both surfaces, depending on the electrical conductors to which these are to be coupled. More definition of this aspect of the invention is provided below. In FIG. 5, an opening 41 is formed within the hardened material 31, preferably using laser or mechanical drilling as was used for opening 21. In one embodiment, opening 41 may possess a diameter of twelve mils.

Figure 6:
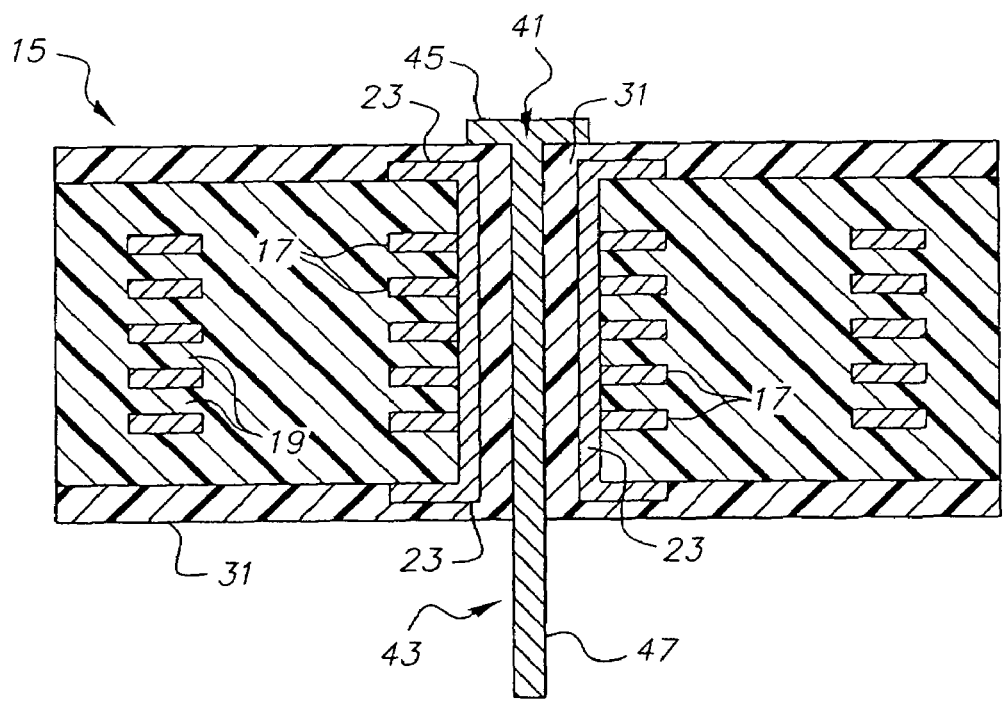

In FIG. 6, a pin 43 in inserted within opening 41 and includes an upper head portion 45 which lies substantially flush with the upper surface of the layer of material 31 and a lower projecting portion 47 which extends from beneath the substrate. Understandably, a pin 43 is located within each of the openings 21 and the single example shown in FIG. 6 is for illustration purposes only. Each pin 43 frictionally fits within the opening 41 specifically designed to accommodate it and is thus firmly held in position. Alternatively, the pin may also be adhesively secured within the opening. In one example, each pin may possess an outer diameter of about twelve mils. Each pin is also electrically isolated from the circuitry and any other conductive parts of substrate 15, including the internal layers 17. The pins as shown thus provide high-speed connections from a conductor which engage the upper head portion and a conductor which engages the projecting end 47. Examples of such conductors include solder balls (e.g., those on an electronic component such as a semiconductor chip) and plated openings (e.g., within a second substrate, not shown), respectively. Such conductors are known in the art and further definition is not deemed needed. Significantly, the outer shielding layer 23, which surrounds the pin in each opening, functions to shield the pin during high-speed signal passage therethrough. The thickness of the material 31 within the opening 21 serves to precisely space the shielding layer from the pin.

Figure 7:
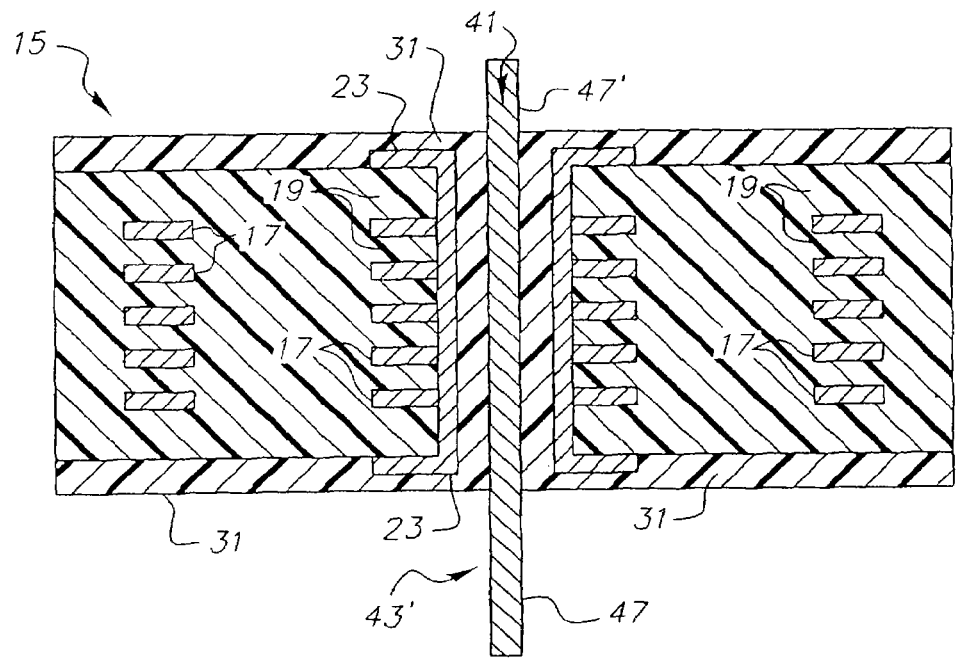
FIG. 7 is a much enlarged, partial side elevational view, in section, representing an alternative embodiment of a pinned interposer of the invention.

In FIG. 7, there is shown an alternative embodiment of a pinned interposer. This embodiment is substantially similar to that in FIG. 6, with the exception that the pin (43') includes a second projecting end portion 47', which projects from the upper surface of the substrate. Portions 47 and 47' may project the same distance from the respective substrate surface or a different distance, depending on the conductors being inter-coupled. In one embodiment, portions 47', being of short length, may be coupled to solder ball conductors.

Figure 8:
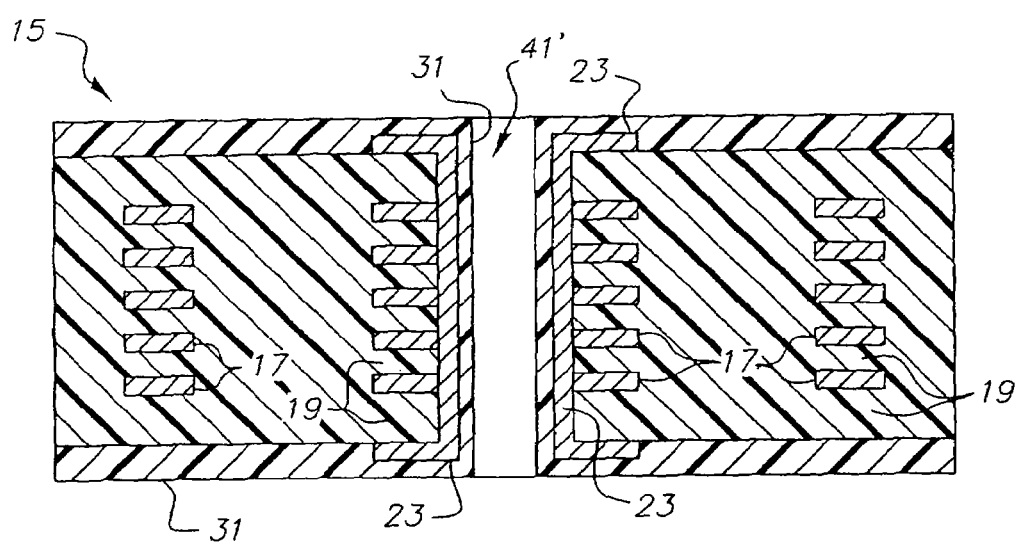
FIGS. 8-10 are much enlarged, partial side elevational views, in section, representing the steps of making an embodiment of the invention adapted for solder ball usage, these steps following the steps of FIGS. 1-4 above.

The FIG. 8 embodiment is similar to the FIG. 5 embodiment, with the exception that the opening 41' formed with dielectric material 31 is larger in diameter than opening 41. In one example, opening 41' may possess a diameter of from about twelve mils to about sixteen mils. FIG. 8 is understood to be the beginning of a series of steps following those defined above with respect to FIGS. 1-4 toward making what will be referred to as a solder ball interposer, meaning a substrate as shown herein in which a plurality of solder balls are utilized as the conductors for which the interposer is adapted for inter-coupling.

Figure 9:
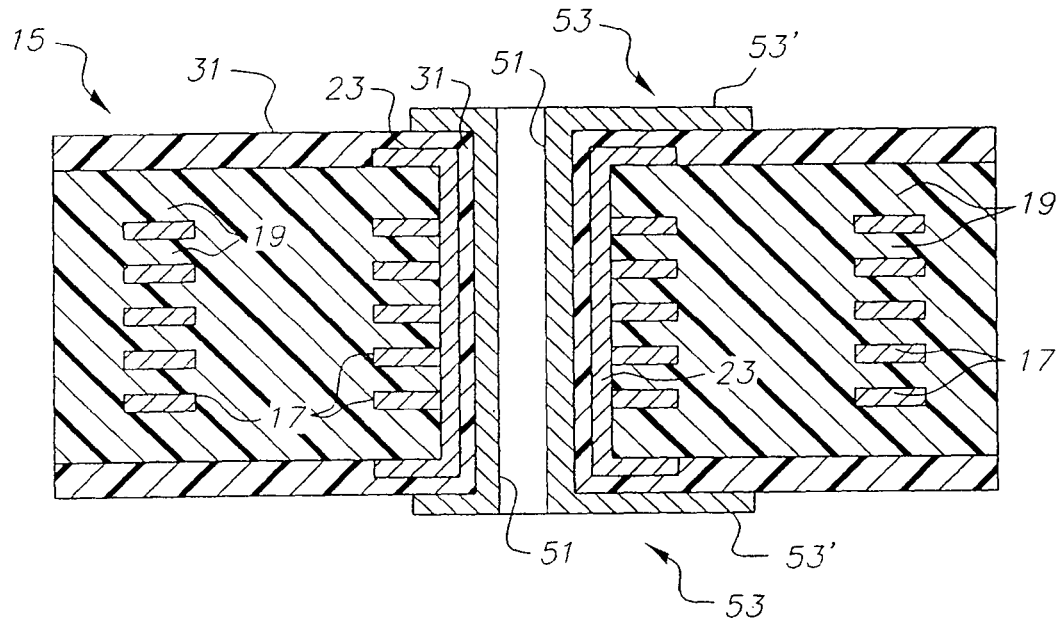

In FIG. 9, a conductive layer 51 is formed on the interior walls of opening 41'. In one embodiment, layer 51 is copper or an alloy thereof and is applied using electroplating. Either electrolytic or electro-less plating may be used for this plating operation. Such methods, like those defined above, are also known in the PCB and chip carrier art and further description is not, therefore, necessary. It is within the scope of the invention to provide metals other than copper or copper alloy. Further, added layers such as nickel and a precious metal such as gold may also be applied, as is also known in the art. In one example, layer 51 may possess a thickness of from about 0.5 mils to about two mils. Layer 51 is also shown to extend out onto the outer surfaces of material 31 on both opposing sides of the substrate. Such extension may result in the formation of the above mentioned "lands" in addition to a projecting signal line (or dogbone structure) (i.e., 53) which may conclude in a pad structure 53' of about the same thickness as the projecting line but preferably has a larger outer diameter (e.g., is preferably cylindrical). In FIG. 9, two such end portions on lines 53 are shown formed substantially opposite one another. This is not meant to limit the invention as the lines may extend in various directions, including opposing.

Figure 10:
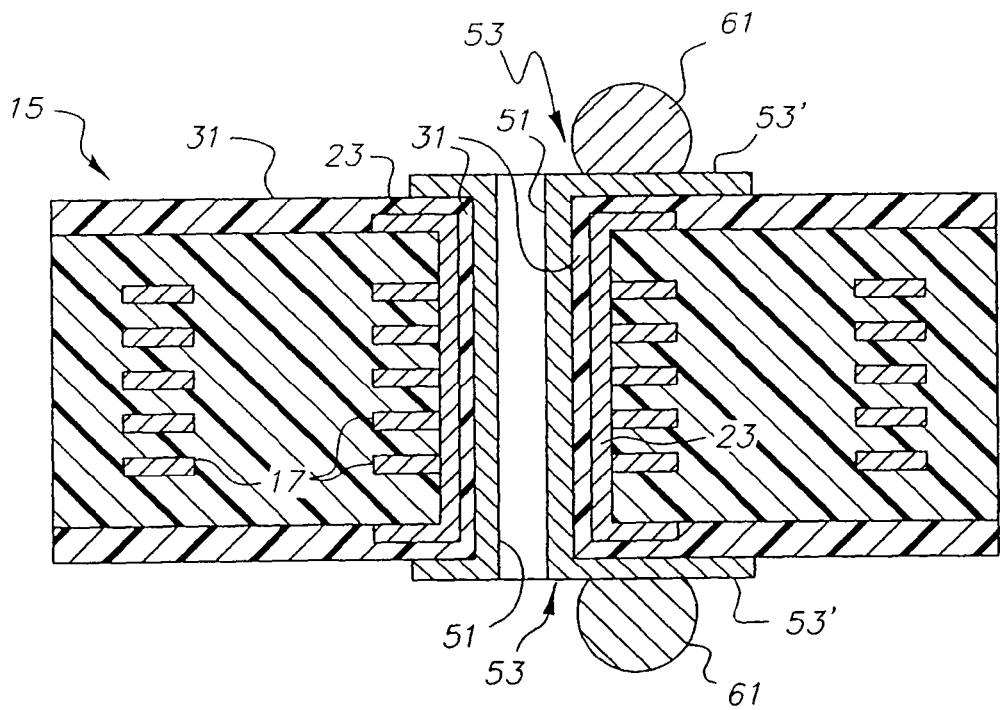

In FIG. 10, each of the pads 53' are shown as having a solder ball 61 positioned thereon. The interposer of FIG. 10 is thus understood to be capable of interconnecting two electrical conductors in the form of such solder balls or the like which may be part of corresponding components such as semiconductor chips, PCBS, chip carriers, etc. By way of example, a chip (on a thin organic substrate) having solder ball conductors may be mounted on the interposer structure of FIG. 10 and the interposer in turn have the lower array of solder balls thereon, each coupled to a respective pad on the lower surface. This assembly may then be positioned on a PCB or chip carrier having an array of conductors (e.g., pads) thereon, and the solder of the lower solder balls re-flowed, thereby forming a solid connection to the respective lower conductors. Other possible combinations for the embodiment shown in FIG. 10 are within the abilities of one skilled in the art and do not require additional description. In one example, the solder balls on the upper part of the interposer may be 90:10 lead:tin solder (or No Lead Solder, i.e., Sn Ag Cu alloy) while those on the interposer's underside may be 63:37 tin:lead solder, these lower solder balls thus having a lower melting point than the upper counterparts. In operation, the internal conductive layer 23 serves to shield the innermost conductive layer 51 during high frequency signal passage through layer 51 (from the solder ball on the upper surface to that on the lower) just as it did for pins 43 and 43'.

Figure 11:
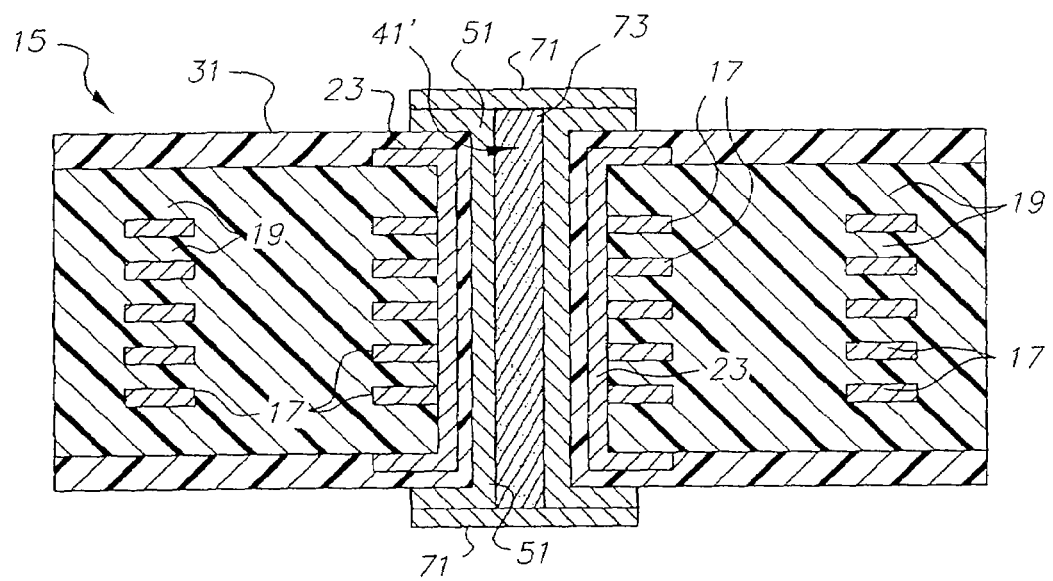
FIGS. 11 and 12 are much enlarged, partial side elevational views, in section, representing the steps of making a version of the invention adapted for solder ball usage, according to an alternative embodiment of the invention, these steps following the steps of FIGS. 1-4 and 8 above.
Figure 12:
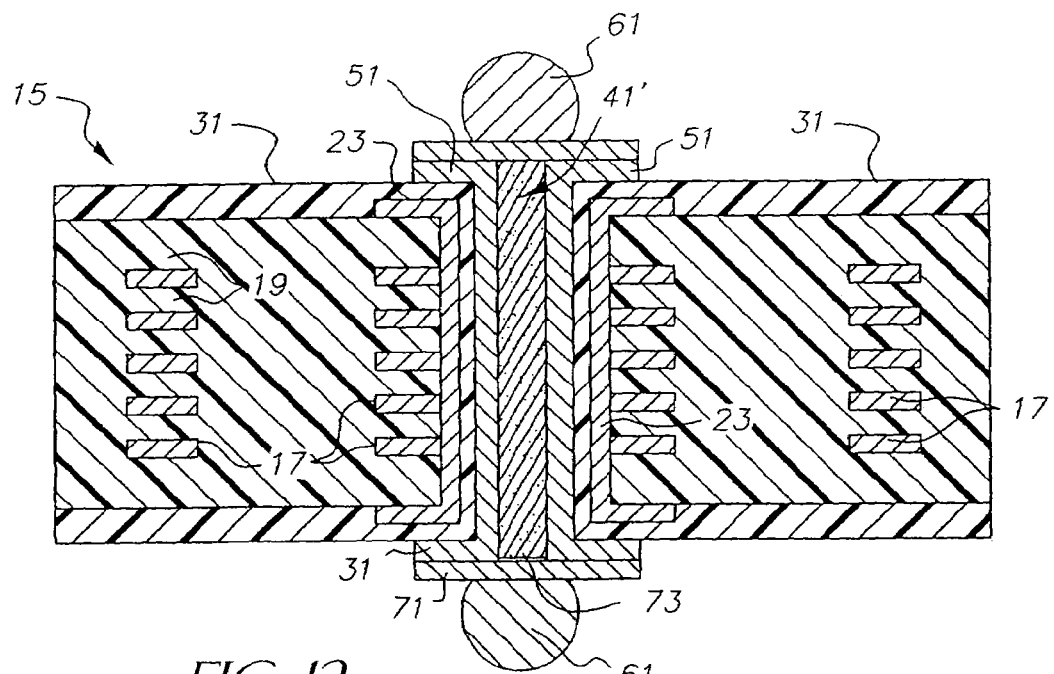

FIGS. 11 and 12 represent an alternative embodiment of a solder ball interposer of the invention. The FIG. 11 embodiment is substantially the same as that of FIG. 9, including the internal conductive layer 51 with the addition of a cap or cover 71 formed over the opposed ends of the opening having layer 51 thereon. Each cap is preferably copper or copper alloy and is formed after filling the opening 41' having conductive layer 51 thereon with either a conductive or non-conductive (electrically) material 73. In one embodiment, material 73 may be copper or silver filled resin (and, therefore, conductive) or silica-filled resin coated copper (and, therefore, non-conductive). Other materials may be used, including, e.g., conventional conductive paste. Material 73 forms a partial base for the cap layer 71, thereby facilitating placement of the caps. Material 73 is hardened prior to such cap formation/placement. In one embodiment, each cap 71 is a copper layer which may be formed from a copper foil or sheet bonded (e.g., laminated) to the substrate and then finalized in configuration using conventional photolithographic processing known in the PCB art for forming circuitry. As seen in FIGS. 11 and 12, the caps 71 also lie atop the "lands" of material 51 which extend over onto the upper and lower substrate surfaces. As such, the caps are relatively rigid and adapted for having various structures coupled thereto. In FIG. 12, one such conductor is a solder ball, each ball coupled to a respective cap 71 as shown. Each solder ball may be the same metallurgy as those defined in FIG. 10, and may form part of similar electrical components. Other combinations are of course possible, as with the FIG. 10 embodiment.

Figure 13:
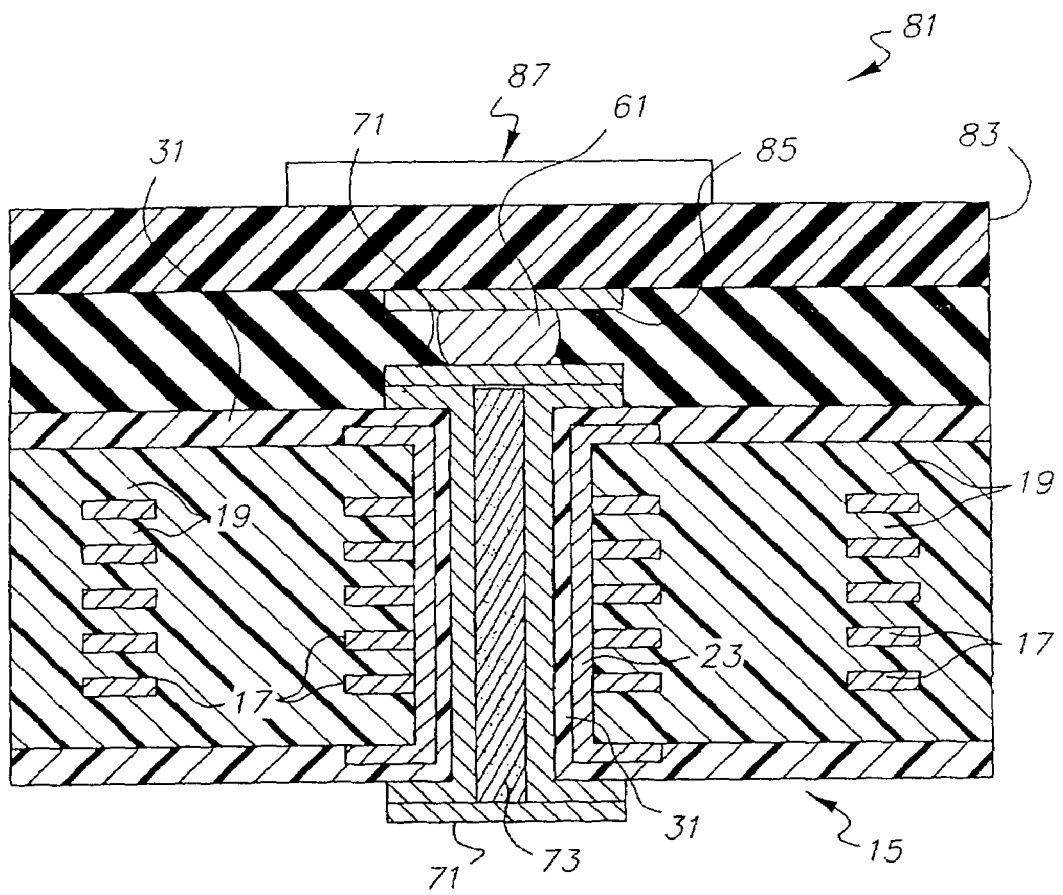
FIG. 13 is a much enlarged, partial side elevational view, in section, representing an electrical assembly which includes as part thereof an interposer according to one embodiment of the invention.

FIG. 13 represents one example of an electrical assembly 81 which may be formed using the teachings of the present invention. Assembly 81 includes the above-defined interposer such as that shown in FIG. 12 (it may be any of those depicted in the other FIGS., however), which is coupled to a substrate 83. In one example, substrate 83 may be a thin laminate film or thin organic substrate having one or more conductive layers therein and a plurality of conductive pads 85 located in a pattern on the film's underside. Only one pad 85 is shown for illustration purposes but as many as 1500 such pads may be used, depending on the operational requirements for assembly 81. In the FIG. 13 embodiment, at least one semiconductor chip 87 is positioned on the film's upper surface and coupled to pads (not shown) using, preferably, solder balls (also not shown). Such solder ball connections for chips is well-known and further detail not required. If the chip's own contact pads are of a greater density than the corresponding pad density for pads 85, suitable through-hole connections (not shown) are used to connect respective ones of the upper surface conductors to pads 85. The thin film laminate may, therefore, be of conventional laminate dielectric material with known internal conductive circuitry, all of which are conventional in the chip carrier art. The invention's interposer is thus understood to be able to couple the chip (more than one, preferably) located on the film's upper surface to a corresponding substrate (e.g., a larger PCB, now shown) directly through the conductive openings formed within the interposer, or through the pins of same if so utilized. In doing so, the conductive openings or pins are protected from the shielding of the formed internal conductive layers. As understood, assembly 81 may be coupled to the lower substrate using solder balls (not shown) if the FIG. 13 embodiment is utilized. Alternatively, pins may be inserted within receptive conductive openings (e.g., conventional through-holes) formed within the substrate. As mentioned earlier, the invention is not limited to LGA connectors. For example, assembly 81 may instead be used as a module, one example being an LGA module, which in turn may be connected to a standard LGA interposer.

Thus there has been shown and described an interposer which is able to interconnect conductive members such that high speed signals may be passed through the interposer and protected (shielded) from unwanted interference. The interposer may be utilized in a fixed embodiment (e.g., soldered to the respective conductors) or as a separable member (e.g., using pins or LGA pads). Significantly, the interposer as defined herein is capable of being manufactured using many conventional PCB and/or chip carrier manufacturing steps, thereby saving considerable time and costs over many known interposers which claim to provide high speed interconnections.

While there have been shown and described what are at present the preferred embodiments of the invention, it will be obvious to those skilled in the art that various changes and modifications may be made therein without departing from the scope of the invention as defined by the appended claims.

What is claimed is:

1. An interposer comprising:

a substrate including first and second opposing surfaces, said substrate including a plurality of dielectric layers, one of said dielectric layers being disposed at the uppermost position of said substrate and a plurality of conductive layers oriented within said substrate in an alternating manner with respect to said plurality of said dielectric layers;

a plurality of openings extending substantially through said substrate from said first opposing surface to said second opposing surface;

a plurality of plated thru holes having lands associated therewith and disposed above and below said first and second opposing surfaces, respectively, each of said plated thru holes positioned within a respective one of said openings and extending substantially from said first opposing surface of said substrate to said second opposing surface of said substrate, wherein each of said plated thru holes and associated lands includes a metal cover disposed on the first opposing surface which substantially covers a first end of said plated thru hole, said cover adapted for engaging a conductor to make electrical contact therewith; and a plurality of shielding members positioned within said substrate and substantially extending from said first opposing surface of said substrate to said second opposing surface of said substrate, each of said shielding members being positioned substantially around a respective one of said plated thru holes forming a space therebetween filled with said dielectric material of said dielectric uppermost layer and connected to at least one conductive layer at a spaced distance from said plated thru hole and adapted for providing shielding for said respective plated thru hole in a stripline transmission line structure during the passage of high frequency signals through said plated thru hole to achieve acceptable levels of electrical noise and crosstalk.

2. The interposer of claim 1 wherein said conductor which said cover is adapted for engaging is a solder ball.

3. The interposer of claim 1 wherein each of said plated thru holes includes first and second covers, each of said covers substantially covering an end of said plated thru hole.

4. The interposer of claim 3 wherein each of said plated thru holes includes a quantity of conductive material therein.

5. The interposer of claim 3 wherein each of said plated thru holes includes a quantity of non-conductive material therein.

* * * * *